(12) United States Patent
Liu et al.

(10) Patent No.: US 9,673,125 B2
(45) Date of Patent: Jun. 6, 2017

(54) INTERCONNECTION STRUCTURE

(71) Applicant: Taiwan Semiconductor Manufacturing Company, Ltd., Hsin-Chu (TW)

(72) Inventors: Hao-Juin Liu, Kaohsiung (TW); Yao-Chun Chuang, Hsin-Chu (TW); Chita Chuang, Kaohsiung (TW); Yu-Jen Tseng, Hsin-Chu (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 53 days.

(21) Appl. No.: 13/664,176

(22) Filed: Oct. 30, 2012

(65) Prior Publication Data

US 2014/0117534 A1 May 1, 2014

(51) Int. Cl.
*H01L 23/48* (2006.01)
*H01L 23/31* (2006.01)
*H01L 23/29* (2006.01)
*H01L 23/00* (2006.01)

(52) U.S. Cl.
CPC ........ *H01L 23/3192* (2013.01); *H01L 23/293* (2013.01); *H01L 23/562* (2013.01); *H01L 24/05* (2013.01); *H01L 24/13* (2013.01); *H01L 24/03* (2013.01); *H01L 24/11* (2013.01); *H01L 2224/0401* (2013.01); *H01L 2224/05005* (2013.01); *H01L 2224/05022* (2013.01); *H01L 2224/05124* (2013.01); *H01L 2224/05144* (2013.01); *H01L 2224/05147* (2013.01); *H01L 2224/05558* (2013.01); *H01L 2224/05572* (2013.01); *H01L 2224/1145* (2013.01); *H01L 2224/11462* (2013.01);
(Continued)

(58) Field of Classification Search
CPC . H01L 2924/00014; H01L 2224/05005; H01L 2224/05124; H01L 2224/05144; H01L 2224/05147; H01L 2224/05572; H01L 2224/1145; H01L 2224/11462; H01L 2224/13147; H01L 2924/206; H01L 2224/0401; H01L 2224/05022; H01L 2224/05558; H01L 2224/13017; H01L 2224/13022; H01L 23/293; H01L 23/3192; H01L 23/562; H01L 24/03; H01L 24/05; H01L 24/11; H01L 24/13
USPC ....... 257/734, 737, 738, 773–775, 207, 758, 257/765; 438/714, 106, 613, 14
See application file for complete search history.

(56) References Cited

U.S. PATENT DOCUMENTS 7,230,338 B2 * 6/2007 Yuzawa ................. H01L 24/13
  257/642
9,257,412 B2 * 2/2016 Chuang ............... H01L 25/0657
(Continued)

*Primary Examiner* — Mohammed Shamsuzzaman
(74) *Attorney, Agent, or Firm* — Slater Matsil, LLP

(57) ABSTRACT

A structure comprises a first passivation layer formed over a substrate, a second passivation layer formed over the first passivation layer, wherein the second passivation layer includes a first opening with a first dimension, a bond pad embedded in the first passivation layer and the second passivation layer, a protection layer formed on the second passivation layer comprising a second opening with a second dimension, wherein the second dimension is greater than the first dimension and a connector formed on the bond pad.

5 Claims, 6 Drawing Sheets

(52) U.S. Cl.
CPC ............... *H01L 2224/13017* (2013.01); *H01L 2224/13022* (2013.01); *H01L 2224/13147* (2013.01)

(56) References Cited

U.S. PATENT DOCUMENTS

| | | | |
|---|---|---|---|
| 2005/0208748 A1* | 9/2005 | Srivastava | H01L 24/10 438/613 |
| 2006/0163725 A1* | 7/2006 | Haba | H01L 21/4846 257/737 |
| 2007/0184578 A1* | 8/2007 | Lin | H05K 3/3452 438/106 |
| 2009/0236637 A1* | 9/2009 | Ko | H01L 23/5286 257/207 |
| 2010/0164098 A1* | 7/2010 | Kuechenmeister | H01L 24/11 257/737 |
| 2010/0187687 A1* | 7/2010 | Liu | H01L 23/3157 257/738 |
| 2010/0263913 A1* | 10/2010 | Daubenspeck | H01L 24/03 174/250 |
| 2011/0084381 A1* | 4/2011 | Lo | H01L 24/11 257/737 |
| 2011/0101520 A1* | 5/2011 | Liu | H01L 23/5329 257/737 |
| 2011/0201208 A1* | 8/2011 | Kawakami | H01L 21/31116 438/714 |
| 2011/0254159 A1* | 10/2011 | Hwang | H01L 24/05 257/738 |
| 2012/0049343 A1* | 3/2012 | Schulze | H01L 24/11 257/737 |
| 2013/0181338 A1* | 7/2013 | Lu et al. | 257/737 |
| 2014/0054764 A1* | 2/2014 | Lu et al. | 257/737 |

* cited by examiner

INTERCONNECTION STRUCTURE

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

As semiconductor technologies further advance, chip-scale or chip-size packaging based semiconductor devices have emerged as an effective alternative to further reduce the physical size of a semiconductor chip. In a chip-scale packaging based semiconductor device, the packaging is generated on the die with contacts provided by a variety of bumps including copper bumps, solder balls and/or the like. Much higher density can be achieved by employing chip-scale packaging based semiconductor devices.

A chip-scale packaging based semiconductor device may comprise a plurality of solder balls formed on a plurality of under bump metallization (UBM) openings of a semiconductor die. Alternatively copper bumps may be employed to electrically connect the semiconductor device with external circuits. There may be a concentration of stress in the areas adjacent to the connection structure of the semiconductor device. For example, an inter-level dielectric layer is located immediately underneath the electrical connection structure. In addition, the inter-level dielectric layer may be formed of an extreme low-k dielectric (ELK) material. As a result, the stress generated by the electrical connection structure may cause the ELK layer to crack or delaminate under stress.

The chip-scale packaging technology has some advantages. One advantageous feature of chip-scale packaging is that chip-scale packaging techniques may reduce fabrication costs. Another advantageous feature of chip-scale packaging based multi-chip semiconductor devices is that parasitic losses are reduced by employing bumps sandwiched between a semiconductor device and a PCB board. In sum, chip-scale packaging based semiconductor devices can achieve smaller form factors, cost-effectiveness, increased performance, lower power consumption and lower heat generation.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, an interconnection structure including a bump having a ladder shaped portion. The disclosure may also be applied, however, to a variety of interconnection structures and bumps. Hereinafter, various embodiments will be explained in detail with reference to the accompanying drawings.

Figure 1:
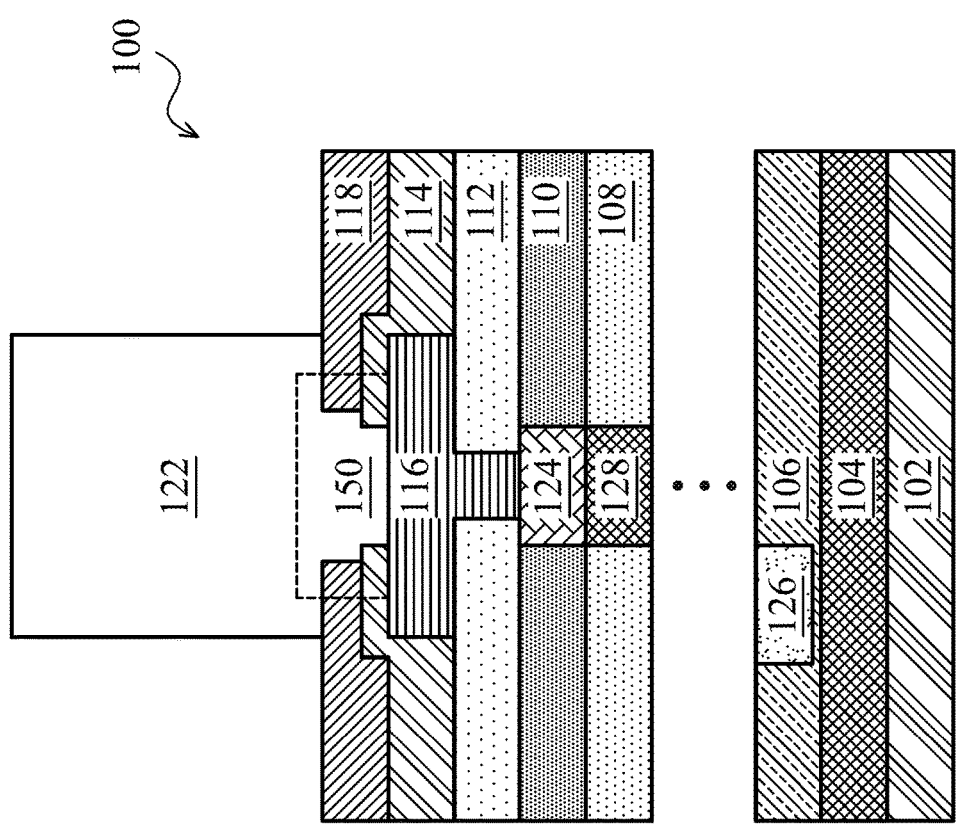
FIG. 1 illustrates a cross sectional view of an interconnection structure in accordance with various embodiments of the present disclosure.

FIG. 1 illustrates a cross sectional view of an interconnection structure in accordance with various embodiments of the present disclosure. A semiconductor device 100 comprises a substrate 102 and an interconnection structure formed over the substrate 102. The interconnection structure includes a ladder shaped portion 150. Such a ladder shaped portion 150 helps to reduce the stress on extreme low-k (ELK) layers. The detailed description of the ladder shaped portion 150 will be described below with respect to FIG. 4.

The substrate 102 may be formed of silicon, although it may also be formed of other group III, group IV, and/or group V elements, such as silicon, germanium, gallium, arsenic, and combinations thereof and/or the like. The substrate 102 may also be in the form of silicon-on-insulator (SOI). The SOI substrate may comprise a layer of a semiconductor material (e.g., silicon, germanium and/or the like) formed over an insulator layer (e.g., buried oxide or the like), which is formed in a silicon substrate. In addition, other substrates that may be used include multi-layered substrates, gradient substrates, hybrid orientation substrates and/or the like. The substrate 102 may further comprise a variety of electrical circuits (not shown). The electrical circuits formed on the substrate 102 may be any type of circuitry suitable for a particular application.

In accordance with an embodiment, the electrical circuits may include various n-type metal-oxide semiconductor (NMOS) and/or p-type metal-oxide semiconductor (PMOS) devices such as transistors, capacitors, resistors, diodes, photo-diodes, fuses and the like. The electrical circuits may be interconnected to perform one or more functions. The functions may include memory structures, processing structures, sensors, amplifiers, power distribution, input/output circuitry or the like. One of ordinary skill in the art will appreciate that the above examples are provided for illustrative purposes only to further explain applications of the present disclosure and are not meant to limit the present disclosure in any manner.

An interlayer dielectric layer 104 is formed on top of the substrate 102. The interlayer dielectric layer 104 may be formed, for example, of a low-K dielectric material, such as silicon oxide. The interlayer dielectric layer 104 may be formed by any suitable method known in the art, such as spinning, chemical vapor deposition (CVD) and plasma enhanced chemical vapor deposition (PECVD) and/or the like. It should also be noted that one skilled in the art will recognize that the interlayer dielectric layer 104 may further comprise a plurality of dielectric layers.

A bottom metallization layer 106 and a top metallization layer 108 are formed over the interlayer dielectric layer 104. As shown in FIG. 1, the bottom metallization layer 106 comprises a first metal line 126. Likewise, the top metallization layer 108 comprises a second metal line 128. Metal lines 126 and 128 are formed of metal materials such as copper or copper alloys and the like. The metallization layers 106 and 108 may be formed through any suitable techniques (e.g., deposition, damascene and the like). Generally, the one or more inter-metal dielectric layers and the associated metallization layers are used to interconnect the electrical circuits in the substrate 102 to each other to form functional circuitry and to further provide an external electrical connection.

It should be noted while FIG. 1 shows the bottom metallization layer 106 and the top metallization layer 108, one skilled in the art will recognize that one or more inter-metal dielectric layers (not shown) and the associated metallization layers (not shown) are formed between the bottom metallization layer 106 and the top metallization layer 108. In particular, the layers between the bottom metallization layer 106 and the top metallization layer 108 may be formed by alternating layers of dielectric (e.g., extreme low-k dielectric material) and conductive materials (e.g., copper).

A dielectric layer 110 is formed on top of the top metallization layer 108. As shown in FIG. 1, a top metal connector 124 is embedded in the dielectric layer 110. In particular, the top metal connector provides a conductive channel between the metal line 128 and the electrical connection structure of the semiconductor device. The top metal connector 124 may be made of metallic materials such as copper, copper alloys, aluminum, silver, gold and any combinations thereof. The top metal connector 124 may be formed by suitable techniques such as CVD. Alternatively, the top metal connector 124 may be formed by sputtering, electroplating and/or the like.

A first passivation layer 112 is formed on top of the dielectric layer 110. In accordance with an embodiment, the first passivation layer 112 is formed of non-organic materials such as un-doped silicate glass, silicon nitride, silicon oxide and the like. Alternatively, the first passivation layer 112 may be formed of low-k dielectric such as carbon doped oxide and the like. In addition, ELK dielectrics such as porous carbon doped silicon dioxide can be employed to form the first passivation layer 112. The first passivation layer 112 may be formed through any suitable techniques such as CVD and/or the like. As shown in FIG. 1, there may be an opening formed in the first passivation layer 112. The opening is used to accommodate the bond pad 116, which will be discussed in detail below.

A second passivation layer 114 is formed on top of the first passivation layer 112. The second passivation layer 114 may be similar to the first passivation layer 112, and hence is not discussed in further detail to avoid unnecessary repetition. As shown in FIG. 1, a bond pad 116 is formed in the openings of the first passivation and second passivation layers. In accordance with an embodiment, the bond pad 116 may be formed of aluminum. For simplicity, throughout the description, the bond pad 116 may be alternatively referred to as an aluminum pad 116.

The aluminum pad 116 may be enclosed by the first and second passivation layers 112 and 114. In particular, a bottom portion of the aluminum pad 116 is embedded in the first passivation layer 112 and a top portion of the aluminum pad 116 is embedded in the second passivation layer 114. The first and second passivation layers 112 and 114 overlap and seal the edges of the aluminum pad 116 so as to improve electrical stability by preventing the edges of the aluminum pad 116 from corrosion. In addition, the passivation layers 112 and 114 may help to reduce the leakage current of the semiconductor device.

A polymer layer 118 is formed on top of the second passivation layer 114. The polymer layer 118 is made of polymer materials such as epoxy, polyimide and the like. In particular, the polymer layer 118 may comprise photo-definable polyimide materials such as HD4104. For simplicity, throughout the description, the polymer layer 118 may be alternatively referred to as the PI layer 118. The PI layer 118 may be made by any suitable method known in the art such as spin coating and/or the like. A redistribution layer (not shown) may be formed in the semiconductor device 100 if the bond pads are relocated to new locations. The redistribution layer provides a conductive path between the metal lines (e.g., metal line 128) and the redistributed bond pads. The operation principles of redistribution layers are well known in the art, and hence are not discussed in detail herein.

The PI layer 118 is patterned to form a plurality of openings. Furthermore, various under bump metal (UBM) structures (not shown) are formed on top of the openings. The UBM structures are employed to connect the aluminum pads (e.g., aluminum pad 116) with various input and output terminals (e.g., connector 122). The UBM structures may be formed by any suitable techniques such as electroplating. Other processes of formation such as sputtering, evaporation, PECVD and/or the like may alternatively be used depending upon the desired materials.

In some embodiments, the connector 122 may be a copper bump. The copper bump may be of a height of approximately 45 um. A variety of semiconductor packaging technologies such as sputtering, electroplating and photolithography can be employed to form the copper bump 122. As known in the art, in order to insure the reliable adhesion and electrical continuity between the copper bump and the bond pad 116, additional layers including a barrier layer, an adhesion layer and a seed layer (not shown respectively) may be formed between the copper bump 122 and the bond pad 116.

Figure 2:
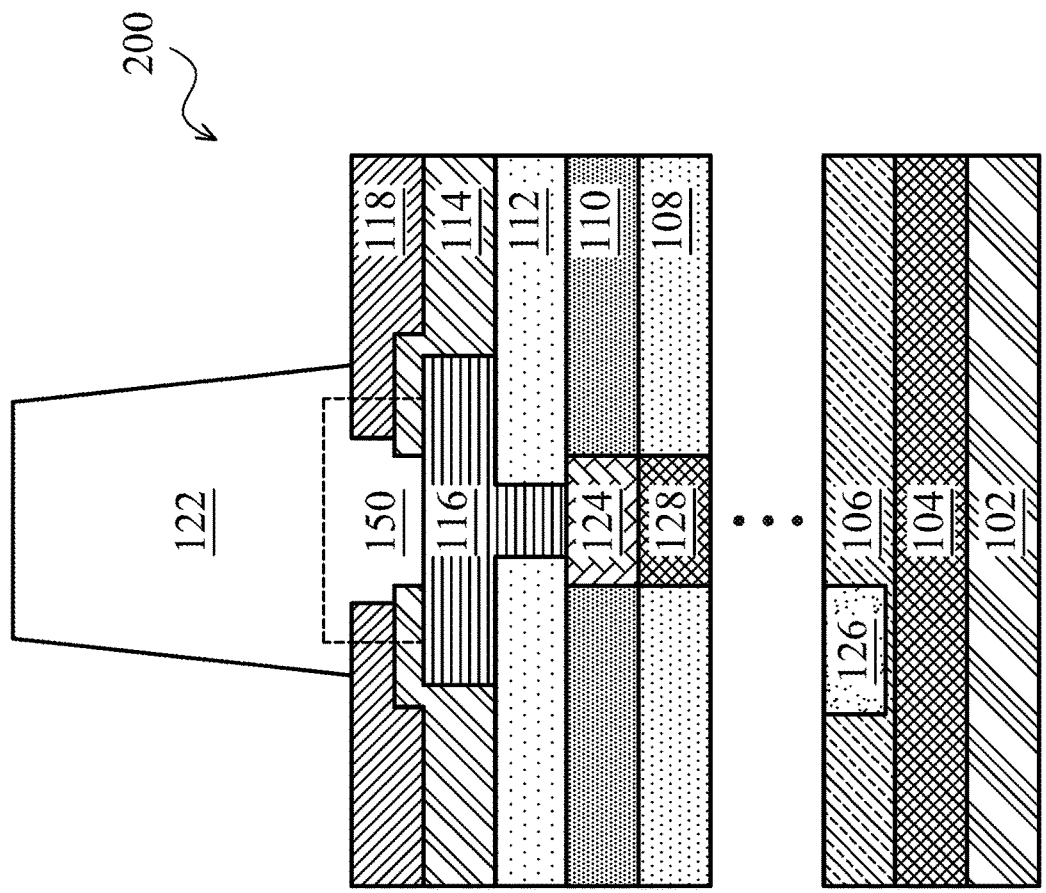
FIG. 2 illustrates a cross sectional view of another interconnection structure in accordance with various embodiments of the present disclosure.

FIG. 2 illustrates a cross sectional view of another interconnection structure in accordance with various embodiments of the present disclosure. The structure of a semiconductor device 200 in FIG. 2 is similar to that shown in FIG. 1 except that the connector 122 is of a trapezoidal shape rather than a rectangular shape. The connector 122 shown in FIG. 2 is commonly referred to as a ladder bump.

Figure 3:
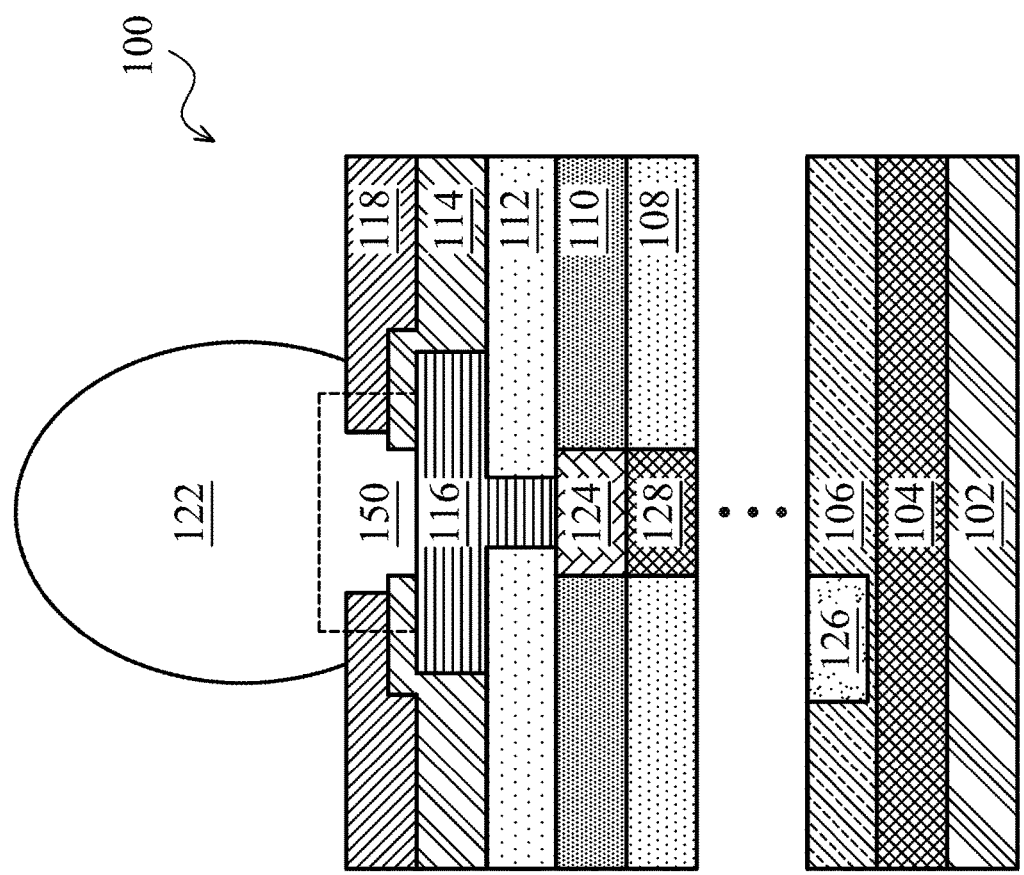
FIG. 3 illustrates a cross sectional view of another interconnection structure in accordance with various embodiments of the present disclosure.

FIG. 3 illustrates a cross sectional view of another interconnection structure in accordance with various embodiments of the present disclosure. The structure of FIG. 3 is similar to FIG. 1 except that the connector 122 is a solder ball. Connector 122 is formed on top of the UBM structure (not shown). In some embodiments, the connector 122 may be a solder ball. The solder ball may be made of any of suitable materials. In accordance with some embodiments, the solder ball may comprise SAC405. SAC405 comprises 95.5% Sn, 4.0% Ag and 0.5% Cu.

It should be noted that the connectors 122 shown in FIG. 1, FIG. 2 and FIG. 3 are merely an example. A person skilled in the art will recognize that the disclosure is applicable to a variety of semiconductor connectors.

Figure 4:
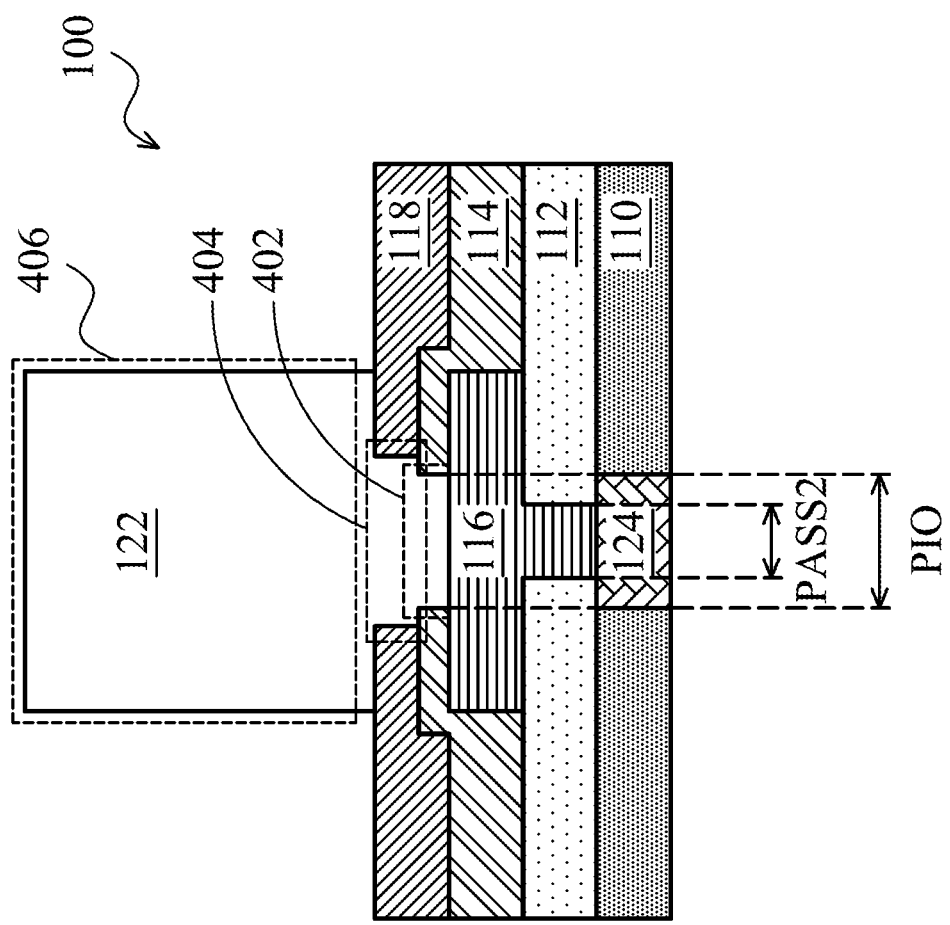
FIG. 4 illustrates a cross sectional view of a portion of the semiconductor device shown in FIG. 1 according to various embodiments of the present disclosure.

FIG. 4 illustrates a cross sectional view of a portion of the semiconductor device shown in FIG. 1 according to various embodiments of the present disclosure. For simplicity, only relevant portions of the semiconductor device 100 shown in FIG. 1 are illustrated in FIG. 4.

As shown in FIG. 4, the connector 122 may comprise three portions 402, 404 and 406. The first portion 402 is surrounded by the second passivation layer 114. In other words, the first portion 402 is in the opening of the second passivation layer 114. Likewise, the second portion 404 is surrounded by the PI layer 118. The second portion 404 is in the opening of the PI layer 118. The third portion 406 protrudes over the top surface of the PI layer 118. It should be noted that the first portion 402 and the second portion 404 form the ladder shaped portion 150 shown in FIG. 1.

As shown in FIG. 4, the third portion 406 is of a dimension greater than the dimension of the second portion 404. Likewise, the second portion 404 is of a dimension greater than the dimension of the first portion 402. In order to better illustrate the dimension difference, the dimension of the opening in the second passivation layer 118 is defined as PASS2. The dimension of the opening in the PI layer 118 is defined as PIO.

It should be noted that FIG. 4 only illustrates a cross sectional view of the semiconductor device 100. The openings of the second passivation layer 114 and the PI layer 118 may be of a variety of shapes from a top view (not shown). The openings of the second passivation layer 114 and the PI layer 118 may be of shapes including polygonal, circular, oval, elongated, any combinations thereof and/or the like.

In some embodiments, in order to reduce the stress on the layers beneath the electrical connection structure, especially the stress on the ELK layers, the dimensions described above are subject to the following restriction:

PASS2<PIO

One advantageous feature of having the restriction shown above is that the dimension restriction helps to reduce the stress on the ELK layers. The reduced stress on the ELK layers helps to prevent some fabrication failures such as delamination and/or the like from occurring.

In some embodiments, by employing the interconnection structure shown in FIG. 4, the stress on the ELK layers may be reduced by 30%. As a result, the chip package integration (CPI) of the semiconductor device 100 may be improved.

Figure 5:
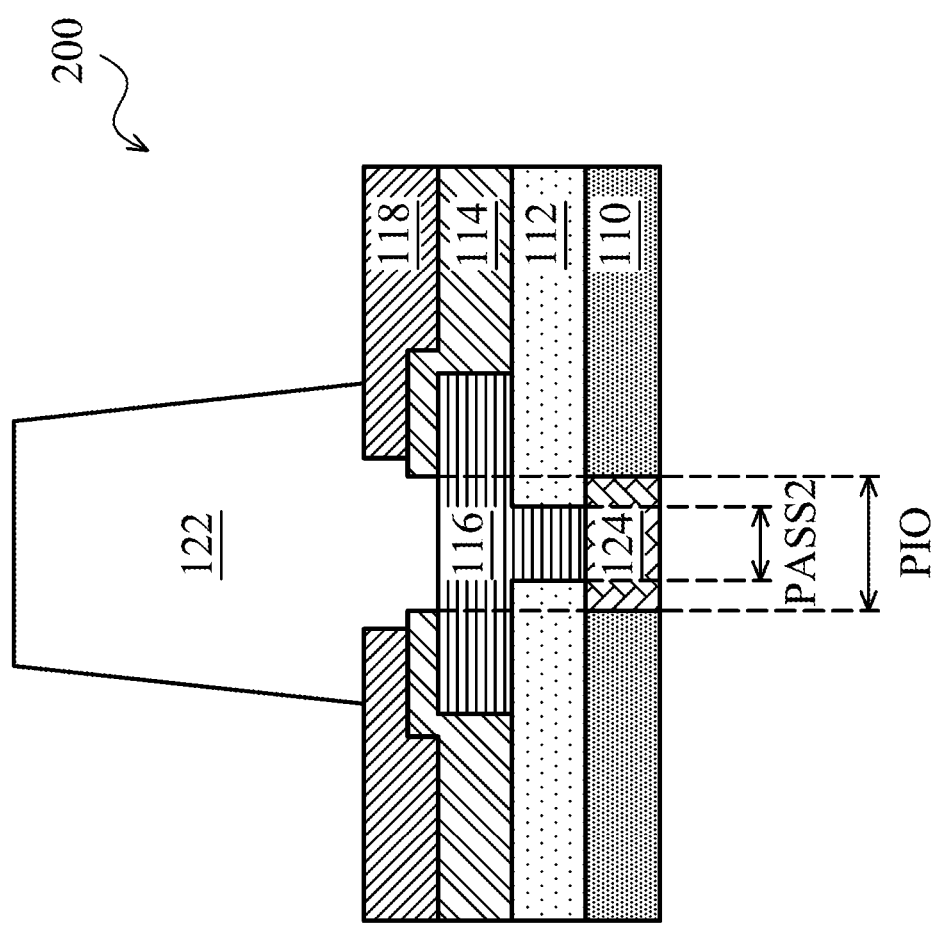
FIG. 5 illustrates a cross sectional view of a portion of the semiconductor device shown in FIG. 2 according to various embodiments of the present disclosure.

FIG. 5 illustrates a cross sectional view of a portion of the semiconductor device shown in FIG. 2 according to various embodiments of the present disclosure. The openings and their dimensions shown in FIG. 5 are similar to the openings and dimensions shown in FIG. 4 except that the rectangular connector 122 is replaced by a trapezoidal connector, and hence are not discussed herein to avoid repetition.

Figure 6:
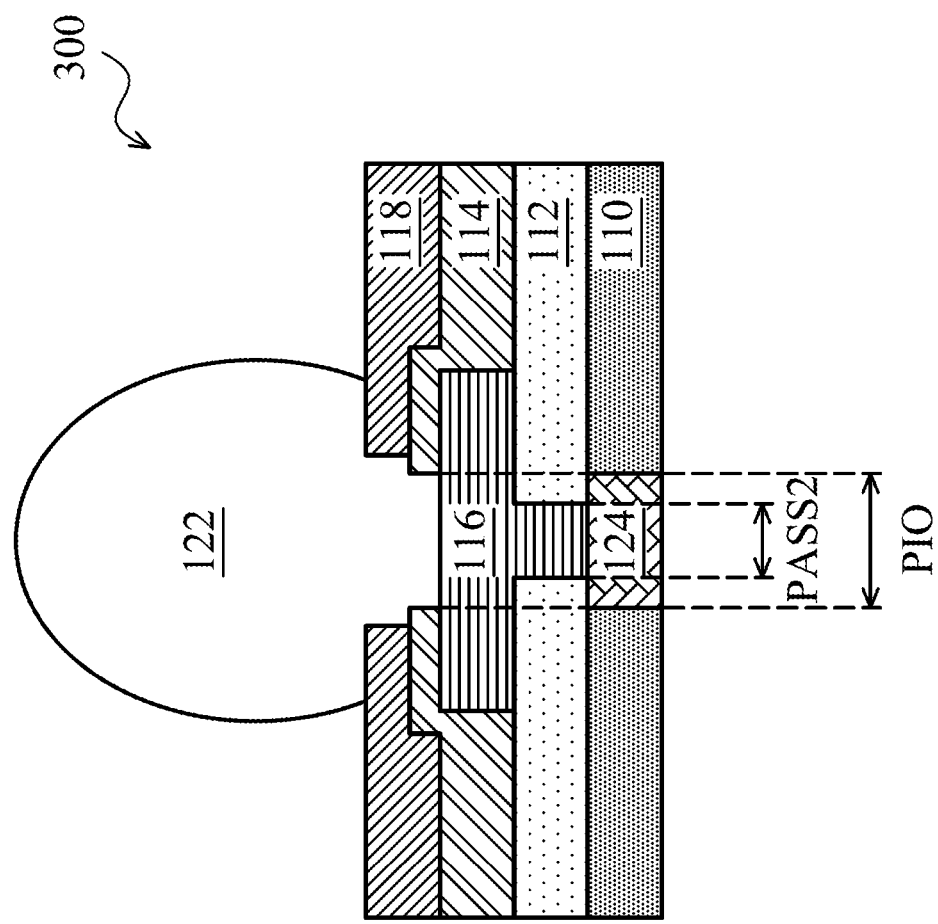
FIG. 6 illustrates a cross sectional view of a portion of the semiconductor device shown in FIG. 3 according to various embodiments of the present disclosure.

FIG. 6 illustrates a cross sectional view of a portion of the semiconductor device shown in FIG. 3 according to various embodiments of the present disclosure. The openings and their dimensions of a semiconductor device 300 shown in FIG. 6 are similar to the openings and dimensions shown in FIG. 4 except that the copper connector 122 is replaced by a solder ball, and hence are not discussed herein to avoid repetition.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
a substrate comprising silicon;
an interlayer dielectric layer over the substrate comprising electrical circuits, wherein the interlayer dielectric layer is formed of a low-k dielectric material;
a bottom metallization layer over the interlayer dielectric layer, wherein the bottom metallization layer comprises a first metal line;
a top metallization layer over the bottom metallization layer, wherein the top metallization layer comprises a second metal line;
a dielectric layer over the top metallization layer, wherein the dielectric layer comprises a metal connector electrically connected to the second metal line and in contact with the second metal line, and wherein a width of the metal connector is equal to a width of the second metal line, and wherein an edge of the metal connector is aligned with an edge of the second metal line;
a first passivation layer over the dielectric layer, wherein the first passivation layer is formed of a first low-k inorganic material;
a second passivation layer over the first passivation layer, wherein the second passivation layer comprises a first opening having a first dimension, and wherein the second passivation layer is formed of a second low-k inorganic material, and wherein the first dimension is equal to the width of the metal connector, and wherein a sidewall of the first opening is aligned with the edge of the metal connector;
a T-shaped bond pad electrically connected to the metal connector, wherein:
a bottom portion of the T-shaped bond pad is embedded in the first passivation layer, and
wherein the bottom portion is in contact with the metal connector and the width of the metal connector is greater than a width of the bottom portion;
an upper portion of the T-shaped bond pad is embedded in the second passivation layer, and wherein a width of the upper portion is greater than the width of the second metal line: and the first passivation layer and the second passivation layer overlap and seal edges of the T-shaped bond pad;
a photo-definable polyimide layer over the second passivation layer, wherein the photo-definable polyimide layer has a second opening having a second dimension, and wherein the second dimension is greater than the first dimension, and wherein the second dimension is greater than the width of the second metal line, and wherein a non-opening portion of the photo-definable polyimide layer has a planar surface; and a connector in the first opening and the second opening, wherein the connector is a solder ball having a first portion in the first opening and a second portion in the second opening, and wherein the first portion of the solder ball is in contact with the second low-k inorganic material and the upper portion of the T-shaped bond pad and wherein the first portion and the second portion form a ladder shaped portion of the connector.

2. The apparatus of claim 1, wherein: the T-shaped bond pad comprises aluminum.

3. The apparatus of claim 1, wherein:
the connector is electrically connected to the electric circuits through the first metal line, the second metal line, the metal connector, and the T-shaped bond pad and the under bump metal structure.

4. The structure of claim 1, wherein:
the connector is rectangular in shape.

5. The structure of claim 1, wherein:
the connector is trapezoidal in shape.

* * * * *